US008981220B2

(12) United States Patent
Fargano

(10) Patent No.: US 8,981,220 B2
(45) Date of Patent: Mar. 17, 2015

(54) UNIVERSAL CABLE ADAPTER

(75) Inventor: Matthew Fargano, Louisville, CO (US)

(73) Assignee: Qwest Communications International Inc., Denver, CO (US)

( * ) Notice: Subject to any disclaimer, the term of this patent is extended or adjusted under 35 U.S.C. 154(b) by 558 days.

(21) Appl. No.: 12/789,219

(22) Filed: May 27, 2010

(65) Prior Publication Data

US 2011/0290521 A1    Dec. 1, 2011

(51) Int. Cl.
| H01R 13/46 | (2006.01) |
| H01J 5/00 | (2006.01) |
| H01J 15/00 | (2006.01) |
| H05K 5/06 | (2006.01) |
| G06F 1/16 | (2006.01) |
| H05K 5/00 | (2006.01) |
| H05K 7/00 | (2006.01) |
| H02B 1/20 | (2006.01) |
| H02G 3/08 | (2006.01) |

(52) U.S. Cl.
CPC .................................. H02G 3/081 (2013.01)
USPC ......... 174/59; 174/50.52; 174/60; 361/679.4; 361/827

(58) Field of Classification Search
CPC ............. H01R 12/75; H01R 13/5208; H01R 13/5816; H01R 13/70; H01R 13/703; H05K 1/0295; H05K 5/0247; H05K 5/069; H05K 7/1404; H05K 7/1491; H02G 3/08; H02G 1/14
USPC ........ 174/51, 50.52, 50.53, 50.56, 59, 60, 64, 174/92, 99 R, 520, 559; 324/76.11; 361/679.4, 826, 827, 828; 439/367
See application file for complete search history.

(56) References Cited

U.S. PATENT DOCUMENTS

| 3,818,283 | A | * | 6/1974 | Ward | 361/827 |
| 4,403,106 | A | * | 9/1983 | Lask et al. | 174/59 |
| 5,420,920 | A | * | 5/1995 | Capper et al. | 439/535 |
| 5,802,170 | A | * | 9/1998 | Smith et al. | 361/119 |
| 5,862,774 | A | * | 1/1999 | Moss | 174/112 |
| RE37,125 | E | * | 4/2001 | Carlson et al. | 379/413.02 |
| 6,621,975 | B2 | * | 9/2003 | Laporte et al. | 385/135 |
| 7,122,738 | B2 | * | 10/2006 | Kanamaru | 174/50 |
| 2002/0181178 | A1 | * | 12/2002 | Ortiz et al. | 361/78 |
| 2009/0080849 | A1 | * | 3/2009 | Hankins et al. | 385/135 |

OTHER PUBLICATIONS

Definition of "port" by www.merriam-webster.com Feb. 11, 2013.*

* cited by examiner

Primary Examiner — Chau N Nguyen
Assistant Examiner — Roshn Varghese
(74) Attorney, Agent, or Firm — Swanson & Bratschun, L.L.C.

(57) ABSTRACT

According to the invention, a system for interconnecting communication cables is disclosed. The system may include an input cable, an output cable, and a cable adapter. The input cable may include a plurality of input wires, each of the plurality of input wires communicatively connected to an input port. The output cable may include a plurality of output wires, each of the plurality of output wires communicatively connected to an output port, The cable adapter may be for communicatively interconnecting the input cable and the output cable. The cable adapter may include a container, a lid and a plurality of attachment mechanisms. The lid may be movably attached to the container. The plurality of attachment mechanisms may be located in the container, each of the plurality of attachment mechanisms capable of communicatively and reversibly connecting one of the plurality of input wires with one of the plurality of output wires.

16 Claims, 6 Drawing Sheets

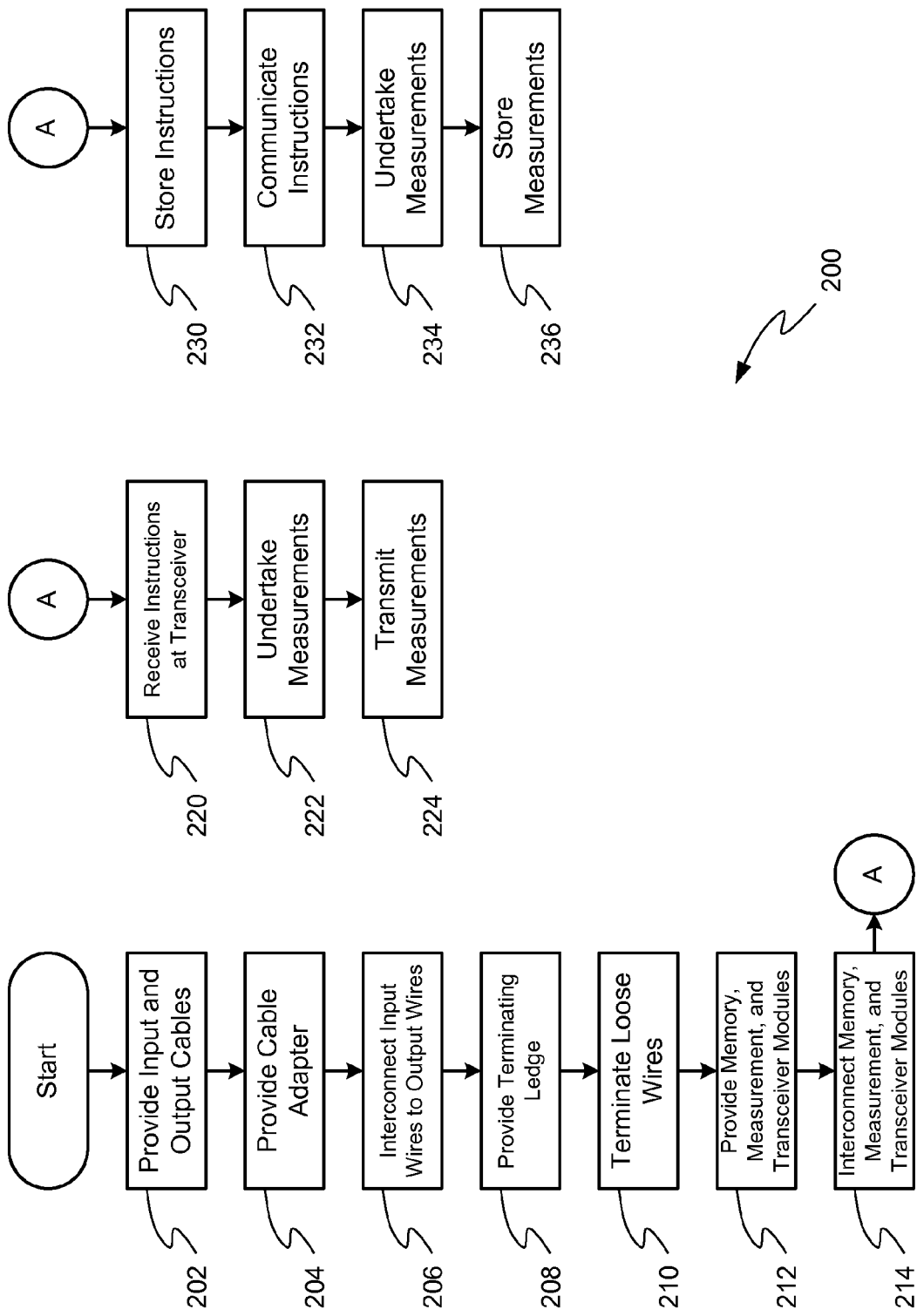

UNIVERSAL CABLE ADAPTER

BACKGROUND OF THE INVENTION

Embodiments of the invention are related to electrical equipment and, in particular, to electrical equipment used in telecommunications.

As information based industries constitute an ever growing part of national economies in many developed as well as developing countries, telecommunication networks have become an essential part of national infrastructure. Especially in developed economies, industries as well as societies are highly dependent on faster and easier access to information, entertainment, and education via the telecommunications networks. Such telecommunications networks require frequent interfaces with each other and with various telecommunications devices. Many of the widely used communications networks and communications devices require proprietary cabling which use distinct pin-outs. Some of the commonly used interconnection pit-outs used by various networks and devices are the DB-9 and the DB-25 pin-outs used by the RS-232 standard, an RJ-11, RJ-14, RJ-25 and RJ-61 pin-outs used by for terminating telephone lines, etc.

Given their different pin-outs, each of these various cables requires special connectors. For example, an RS-232 cable with a DB-9 pin-out requires a special connector with two rows of connections, with a first row with five connectors and a second row with four connectors. Similarly, an RS-232 cable with a DB-25 pin-out requires a special connector with a first row with thirteen connectors and a second row with twelve connectors. Generally, when a user encounters a situation where one end of the connection has a DB-9 connector that needs to be connected to another end which has a DB-25 connector, the user may use a DB-9 to DB-25 converter. However, given the large number of different pin-outs used in industry, this would require that a user has to carry with them an almost unlimited number of converters that would match each combination of pin-outs on two ends.

Moreover, while the converters for many possible combinations, for example DB-9 to DB-25, are readily available and affordable, converters for some exotic combinations of pin-outs are not. Therefore, quite often it may become very inconvenient
or nearly impossible for a technician at the location requiring such a connection to make necessary connection, leading to potential delays in providing the final communications connections.

As a result, technicians often resort to making their own version of improvised converters using standard cables. However, making these cables correct, even after a first, second, or even third attempt is not always successful. Even when the technician knows the wire requirements on one end, they may not know the pinout requirement on the other end. This may require the technician to go through much experimentation on cables, wasting time and materials. The problem becomes even more acute when the cable length available is finite and too much experimentation may result in a loss of valuable cable length due to many cuts and retries. Moreover, the more a technician experiments with cables to make temporary connections, more it is likely that permanent damage is done to one or more of the cables involved.

Embodiments of the present invention provide solutions to these and other problems.

BRIEF DESCRIPTION OF THE INVENTION

In one embodiment, a system for interconnecting communication cables is provided. The system may include an input cable, an output cable, and a cable adapter. The input cable may include a plurality of input wires, each of the plurality of input wires communicatively connected to an input port. The output cable may include a plurality of output wires, each of the plurality of output wires communicatively connected to an output port. The cable adapter may be for communicatively interconnecting the input cable and the output cable. The cable adapter may include a container, a lid and a plurality of attachment mechanisms. The lid may be movably attached to the container. The plurality of attachment mechanisms may be located in the container, and each of the plurality of attachment mechanisms may be configured to communicatively and reversibly connect one of the plurality of input wires with one of the plurality of output wires.

In another embodiment, a method for connecting communications cables is provided. The method may include providing an input cable having a plurality of input wires, each of the plurality of input wires communicatively connected to an input port. The method may also include providing an output cable having a plurality of output wires, each of the plurality of output wires communicatively connected to an output port. The method may additionally include providing a cable adapter for communicatively interconnecting the input cable and the output cable. The cable adapter may include a container, a lid, and a plurality of attachment mechanisms. The lid may be movably attached to the container. The plurality of attachment mechanisms may be located in the container, and each of the plurality of attachment mechanisms may be capable of removably connecting one of the plurality of input wires with one of the plurality of output wires. The method may moreover include interconnecting one or more of the plurality of the input wires with one or more of the plurality of output wires using one or more of the plurality of attachment mechanisms.

In another embodiment, a system for interconnecting communication cables is provided. The system may include an input cable, an output cable, and a cable adapter. The input cable may include a plurality of input wires, and each of the plurality of input wires may be communicatively connected to an input port. The output cable may include a plurality of output wires, and each of the plurality of output wires may be communicatively connected to an output port. The cable adapter may be for communicatively interconnecting the input cable and the output cable. The cable adapter may include a container, a lid, and a plurality of attachment mechanisms. The lid may be movably attached to the container. The plurality of attachment mechanisms may be located in the container, and each of the plurality of attachment mechanisms may be configured to removably connect one of the plurality of input wires with one of the plurality of output wires. One or more of the plurality of the input wires may be communicatively connected with one or more of the plurality of output wires using at least one of the plurality of attachment mechanisms.

BRIEF DESCRIPTION OF THE DRAWINGS

The present invention is described in conjunction with the appended figures:

FIG. 2a is a side view of the connector ledge of FIG. 2;

FIG. 3a is a side view of the terminating groove of the cable adapter of FIG. 3;

FIG. 6 is a block diagram of a method of connecting communication cables using the cable adapter of FIG. 1.

Figure 1:
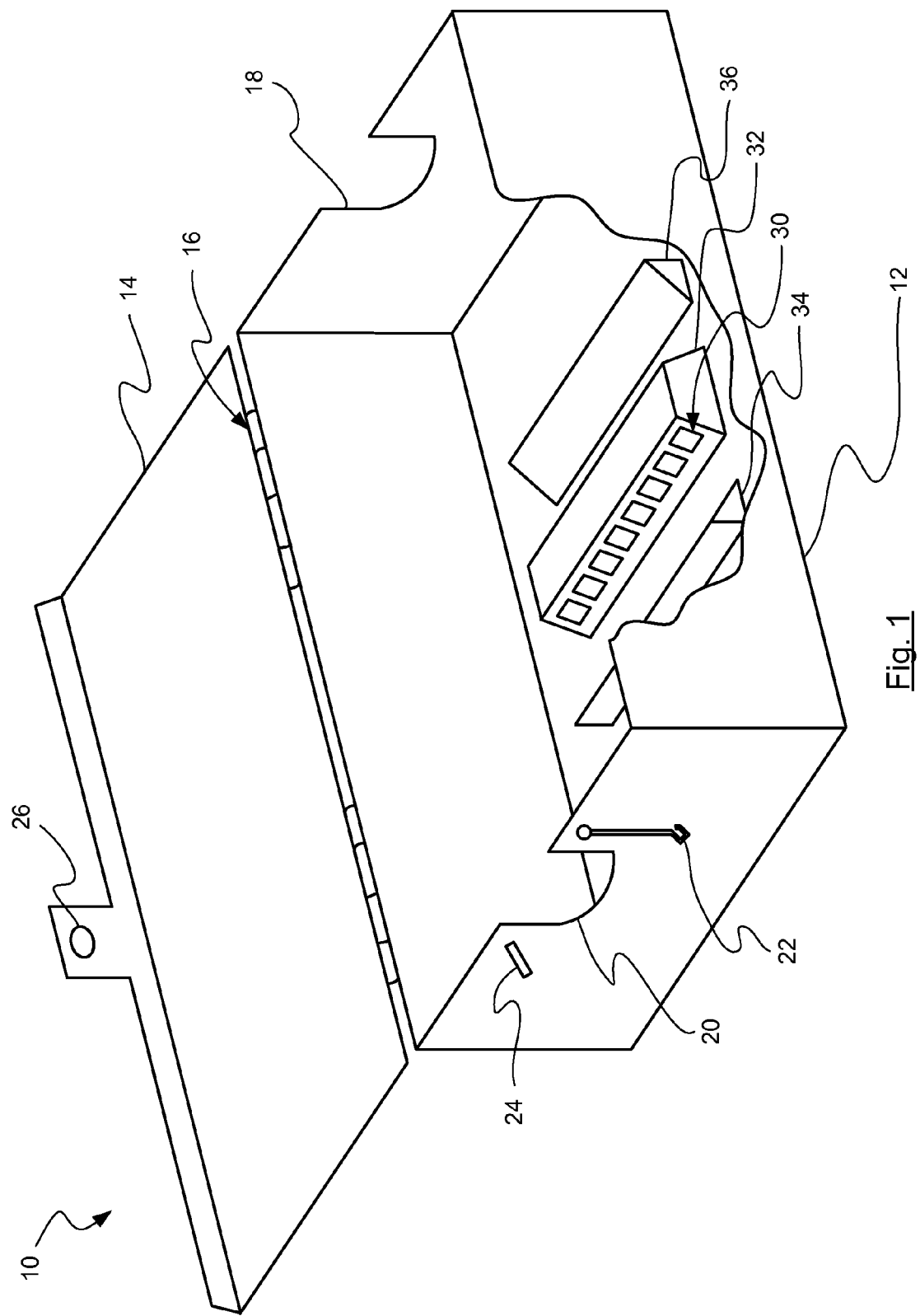
FIG. 1 is a simplified diagram of one embodiment of a cable adapter.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION OF THE INVENTION

The ensuing description provides exemplary embodiments only, and is not intended to limit the scope, applicability or configuration of the disclosure. Rather, the ensuing description of the exemplary embodiments will provide those skilled in the art with an enabling description for implementing one or more exemplary embodiments. It being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

The term "machine-readable medium" includes, but is not limited to portable or fixed storage devices, optical storage devices, wireless channels and various other mediums capable of storing, containing or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Unless the context clearly indicates otherwise, as used herein, the term "connect," means to place into communication (for example, optical communication, electrical communication, etc.) the two elements being connected, for example, so that signals (optical, electrical) may be passed unidirectionally and/or bidirectionally from one element to the other. This functionality may include, but need not necessarily include, physically coupling the two elements (possibly via one or more intermediary apparatuses), securing such a physical coupling, and/or the like. Similarly, two elements that are said to be "connected" are in communication with one another to allow signals to pass from one element to the other, and a "connection" between two elements means that the two elements are in communication with one another.

Turning first to FIG. 1, a simplified diagram is shown of one embodiment of a universal cable adapter 10. The cable adapter 10 of FIG. 1 may be used to communicatively interconnecting an input cable with an output cable. Cable adapter 10 includes an open container 12 and a lid 14. Container 12 and lid 14 may be made of any commonly known sturdy and/or flexible material that can be used to make conduits in telecommunication systems. For example, in one embodiment, container 12 and lid 14 may be made of Semi-Rigid Polyvinyl Chloride material that is structured to provide insulation to various conductors of the input cable and the output cable.

Container 12 and lid 14 illustrated in FIG. 1 are made in rectangular shape, however, in alternative embodiments, container 12 and lid 14 may be made in any other shapes, such as in cylindrical shape, square shape, etc. Container 12 and lid 14 are shown connected to each other by a hinge mechanism 16. In alternate embodiments, any other mechanism may be used to attach container 12 and lid 14. For example, in one alternative, container 12 and lid 14 may be connected to each other by hook and bolt mechanism on each of the four sides or corners of container 12 and lid 14. In yet another alternative embodiment, at least part of lid 14 may be made transparent or translucent so that a technician using cable adapter 10 can see inside container 12 without having to open lid 14.

Container 12 may also be provided with input grooves 18 and 20 located on two opposite sides. In FIG. 1, grooves 18 and 20 are illustrated as being of slotted and/or semi-circular shape at the upper edge of container 12. In an alternate embodiment these grooves may be of an alternate shape and may be located in an alternate location. For example, in an alternate embodiment, grooves 18 and 20 may be of circular shape and located in the middle of the sides of container 12. In yet alternate embodiment, the grooves may be of rectangular or triangular shape to better accommodate the shape of the input cable and the output cable, or a washer attached thereto. In some embodiments of cable adapter 10 at least a part of grooves 18 and 20 may be located on lid 14. Various containers 12 with variable sizes of grooves 18 and 20 may be provided so as to accommodate cables of varying sizes.

Cable adapter 10 illustrated in FIG. 1 includes a hook and eye mechanism with a hook 22 attached to one side of the groove 20 and an eye 24 attached to the other side of groove 20. Such hook and eye mechanism can be provided to securely attach an input and/or output cable to container 12 once such input or output cable is laid on groove 20. A similar hook and eye mechanism may also be provided with groove 18. In an alternate embodiment, an alternate fastening mechanism, for example Velcro®, etc., may also be provided to securely attach the input or output cable that is laid on grooves 18 and 20. Additionally, cable adapter 10 may also be provided with a locking mechanism 26 that may be used to lock lid 14 securely over container 12. Such locking mechanism can be any of the commonly known locks such as a padlock, a combination lock, an electronic lock, etc. In an alternate embodiment, a locking mechanism may be provided inside of container 12. Moreover, such locking mechanism may also be flexible/bendable and made with some elastic material such as a rubber band.

In yet alternate embodiment a soft (compressible) rubber-like semi-circular grommet may be provided as a liner for grooves 18 and 20 with a soft-rubber like male mate for grooves 18 and 20 that fits into the grooves when lid 14 is closed. As a result, in the closed position of cable adapter 10, there may be a gap that is smaller than the size (circumference) of a typical cable and with a cable, the soft rubber like grommet and male mate exert a light pressure and friction on such cable to hold the cable in its place. In yet another embodiment, a very small heavy-duty rubber like cord that is permanently attached on one end below grooves 18 and 20 may be provided on the inside of container 12. On the other end of the cord, a small round opening or hook that is attached to a peg or a hook on the other side of grooves 18 and 20 may be provided. In such an implementation, when the cord is attached, the friction will be able to tie down the cable to grooves 18 and 20 and hold it in proper position.

Cable adapter 10 also includes a plurality of attachment mechanisms 30 located inside container 12. In the embodiment illustrated herein, a plurality of attachment mechanisms 30 are located on a protruding connector ledge 32 that may be attached to the bottom of container 12. In an example embodiment, such connector ledge 32 may be detachably attached to container 12 in a manner so that if there is any damage to any of connectors 30 on connector ledge 32, connector ledge 32 may be removed without having to make any major changes to adapter 10. Another advantage of having connector ledge 32 being removable is that it allows a user to change the number of connectors 30 provided by cable adapter 10. For example, a given prototype of cable adapter 10 may have a connector ledge 32 providing ten attachment mechanisms 30, however, if it becomes necessary to make twelve connections, the user may simply detach the connector ledge 32 with a new connector ledge 32 having twelve attachment mechanisms 30. A detailed view of one embodiment of the attachment mechanisms 30 on one embodiment of connector ledge 32 is provided further below in FIG. 2.

Additionally, the cable adapter 10 also includes a set of wire terminating ledges, the input terminating ledge 34 and the output terminating ledge 36, each located on one side of connector ledge 32. Input terminating ledge 34 and output terminating ledge 36 contains a number of terminating mechanisms, as further described below in FIG. 3. Input terminating ledge 34 may be used to connect any wires from an input cable that are not to be connected to one or more wires from an output cable. Similarly, output terminating ledge 36 may be used to connect any wires from an output cable that are not to be connected to one or more wires from an input cable. Terminating ledges 34 and 36 ensure that there are no loose wires in container 12, thus limiting the risk of any accidental or unintentional connection between one or more wires from an input cables with one or more wires from an output cable. Note that even though in the embodiment disclosed herein input terminating ledge 34 and output terminating ledge 36 are separate, in an alternate embodiment only one terminating ledge may be provided. In such as case, some of the terminating mechanisms of the same terminating ledge may be used to terminate one or more wires from an input cable and some of the terminating mechanisms from the same terminating ledge may be used to terminate one or more wires from an output cable. Moreover, terminating ledges 34 and 36 may be implemented as part of container 12, for example in the bottom surface of the container, so that installation of additional ledges is or is not necessary.

In one embodiment of cable adapter 10, a number of sockets (not shown herein) may also be provided where such sockets are located either inside cable adapter 10 or they may be communicatively attached to cable adapter 10. Thus for example, in one embodiment of cable adapter 10, a socket for a memory module, a socket for a transceiver, and a socket for a measurement module may be provided with cable adapter 10. Moreover, if it is necessary that one or more of the memory module, the transceiver, and the measurement module may require an AC power connection, a socket for such a connection may also be provided.

Note that while container 12 and lid 14 of the cable adapter 10 are both rectangular in shape, container 12 and lid 14 of cable adapter 10 may also be of a semi-circular shape. As a result, at least in some applications, such cable adapter 10 with circular casing (combined semi-circular container and semi-circular lid) can be carried with and stored away more conveniently than the cable adapter 10. While only two different types of cable adapters are disclosed herein, cable adapter 10 may be configured in a number of other shapes, such as triangular, etc.

Figure 2:
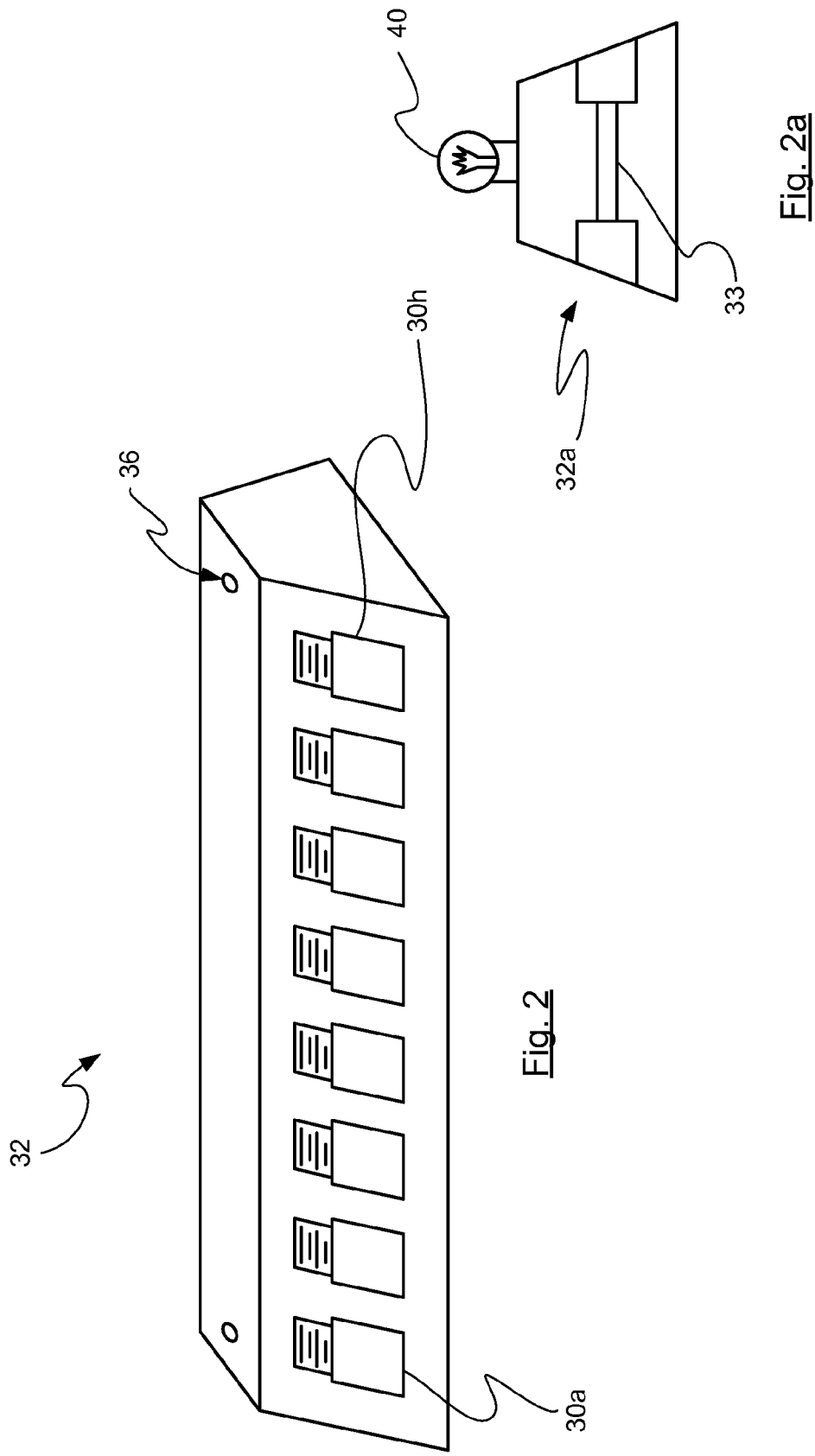
FIG. 2 is a detailed view of a connector ledge of the cable adapter of FIG. 1.

A detailed view of one version of attachment mechanisms 30 on a embodiment of connector ledge 32 is illustrated in FIG. 2. In the example embodiment of FIG. 2, connector ledge 32 has eight attachment mechanisms 30a to 30h. FIG. 2 shows only one side of each attachment mechanisms 30a-30h. Another end of these attachment mechanisms 30a-30h will be on the opposite side of connector ledge 32. Note that in the example embodiment, attachment mechanisms 30a-30h are shown to be implemented using push-in female connections. However, in an alternate embodiment, other types of connectors may also be used. For example, in an alternate embodiment, attachment mechanisms 30a-30h may be screw-in type of connectors. In yet another embodiment, each of the attachment mechanisms 30a-30h may be male connectors that are adapted to connect to female connectors at the ends of the input cable wires and the output cable wires. Connector ledge 32 may be removably attached to container 12, possibly using screws 36 or other fastening mechanism. This allows a user to exchange connector ledge 32 having a given number of attachment mechanisms 30a-30h with another connector ledge 32 having a different number of attachment mechanisms 30. Thus for example, if cable adapter 10 has connector ledge 32 with six attachment mechanisms 30a-30f and if there is a need for interconnecting eight input wires with eight output wires, the user can simply replace connector ledge 32 which has six attachment mechanisms 30a-30f with another connector ledge 32 with eight attachment mechanisms 30a-30h.

FIG. 2a illustrates a side view 32a of connector ledge 32. As shown by side view 32a, each of attachment mechanisms 30a-30h may be implemented with an internal connector 33 of any well known conducting material such as copper, aluminum, etc (or optical connector in such embodiments). In one embodiment of connector ledge 32, each of the attachment mechanisms 30a-30h may have a signaling mechanism 40, such as a light emitting diode (LED), a wireless signal transceiver, etc. Such signaling mechanism 40 may be designed so as to generate a signal when an attachment mechanism has conductively/actively connected an input wire/fiber with an output wire/fiber. Such signaling mechanism 40 may be located inside cable adapter 10 on connector ledge 32, or outside cable adapter 10. In one embodiment of cable adapter 10, signaling mechanism 40 may be adapted send a wireless signal to a central server system, a pager, a cell-phone, etc. Moreover, such signaling mechanism 40 may also be designed so as to generate a signal any time the connection established by the attachment mechanisms 30a-30h is disturbed or disconnected. In yet another alternate embodiment, signaling mechanism 40 may also be further adapted to monitor the signal traffic through each of attachment mechanisms 30a-30h and communicate information about such traffic to a desired location in a wireless manner.

The signal mechanisms 40 provided herein may be used to convey different information about the connectivity of and communication through the attachment mechanisms 30a-30h. For example, signal mechanisms 40 may be LEDs and may be color coded to convey information about rate of data communication through the attachment mechanisms 30a-30h. Alternatively, the LEDs or other indicators may be set to blink at different rates to convey different information.

In an alternate embodiment, cable adapter 10 may further include a wireless transceiver to receive instructions wirelessly. Such wireless transceiver may be located inside or outside cable adapter 10 and it may receive instructions from a central server or from a user in a wireless manner. Such instructions may be, for example, to check the status of a connection between a given input wire and a given output wire, etc. Additionally, cable adapter 10 may also include a measurement mechanism located on connector ledge 32 to measure signal levels on each of plurality of attachment mechanisms 30a-30h. Such measurement mechanism may be, for example, an ammeter to measure the electrical current through attachment mechanisms 30a-30h, a counter to count the number of pulses transmitted through attachment mechanisms 30a-30h in a given time period, etc. Cable adapter 10 may also use the transceiver to transmit the information collected by the measurement mechanism to a central server, to a pager, to a cell-phone, etc.

In an alternate embodiment, cable adapter 10 may also further include a memory module, wherein the memory module is adapted to store instructions and measurements collected from the measurement mechanism. For example, a user may store instructions on the memory module related to the frequency of measurements to be taken by the measurement mechanism, instructions to generate a signal based on the measurements, etc. The measurement mechanism may be attached to the memory module in a manner so as to receive instructions from the memory module and to provide measurements to the memory module. Providing cable adapter 10 with the memory module and the measurement module allows a user to store various instructions on the memory module after completing an initial set-up of cable adapter 10. Subsequently, the user can come back at a later point to merely collect the data from the memory module for further analysis. For example, the user may store instructions to measure the communication activity on each of attachment mechanisms 30a-30h for a twenty-four hour period and at the end of such pre-set time period, the user may collect the information from the memory module on, say a USB drive that the user can analyze later on using a computer, etc.

Figure 3:
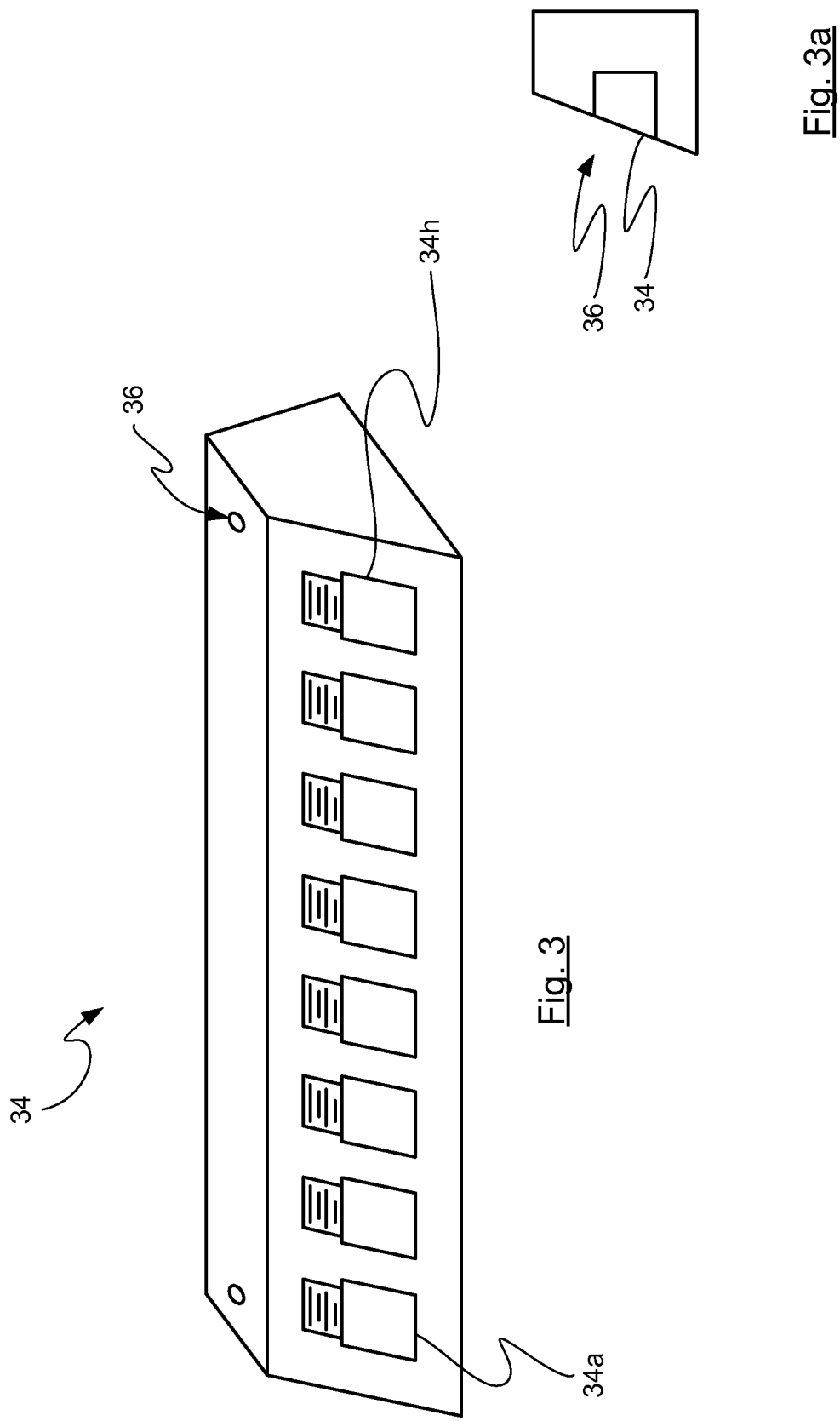
FIG. 3 is a detailed view of a terminating groove of the cable adapter of FIG. 1.

A detailed view of one version of terminating ledge 34 is provided in FIG. 3 (side view in FIG. 3a). In this example embodiment, terminating ledge 34 has eight terminating mechanisms 34a-34h. However, in an alternate embodiment, terminating ledge 34 may have more or less number of terminating mechanisms 34a-34h. Terminating mechanisms 34a-34h are different in structure from attachment mechanisms 30a-30h of FIG. 2. Specifically, while attachment mechanisms 30a-30h are designed to communicatively connect two wires, one on each end of the attachment mechanism, terminating mechanisms 34a-34h are not designed to provide any communicative connection. As such, terminating mechanisms 34a-34h are used to ensure that any wires from an input cable that are not to be connected to any wires from an output cable (and vice-versa) are terminated properly using terminating mechanisms 34a-34h. This ensures that such terminated wires are not accidentally interconnected to any other input or output wires.

Figure 4:
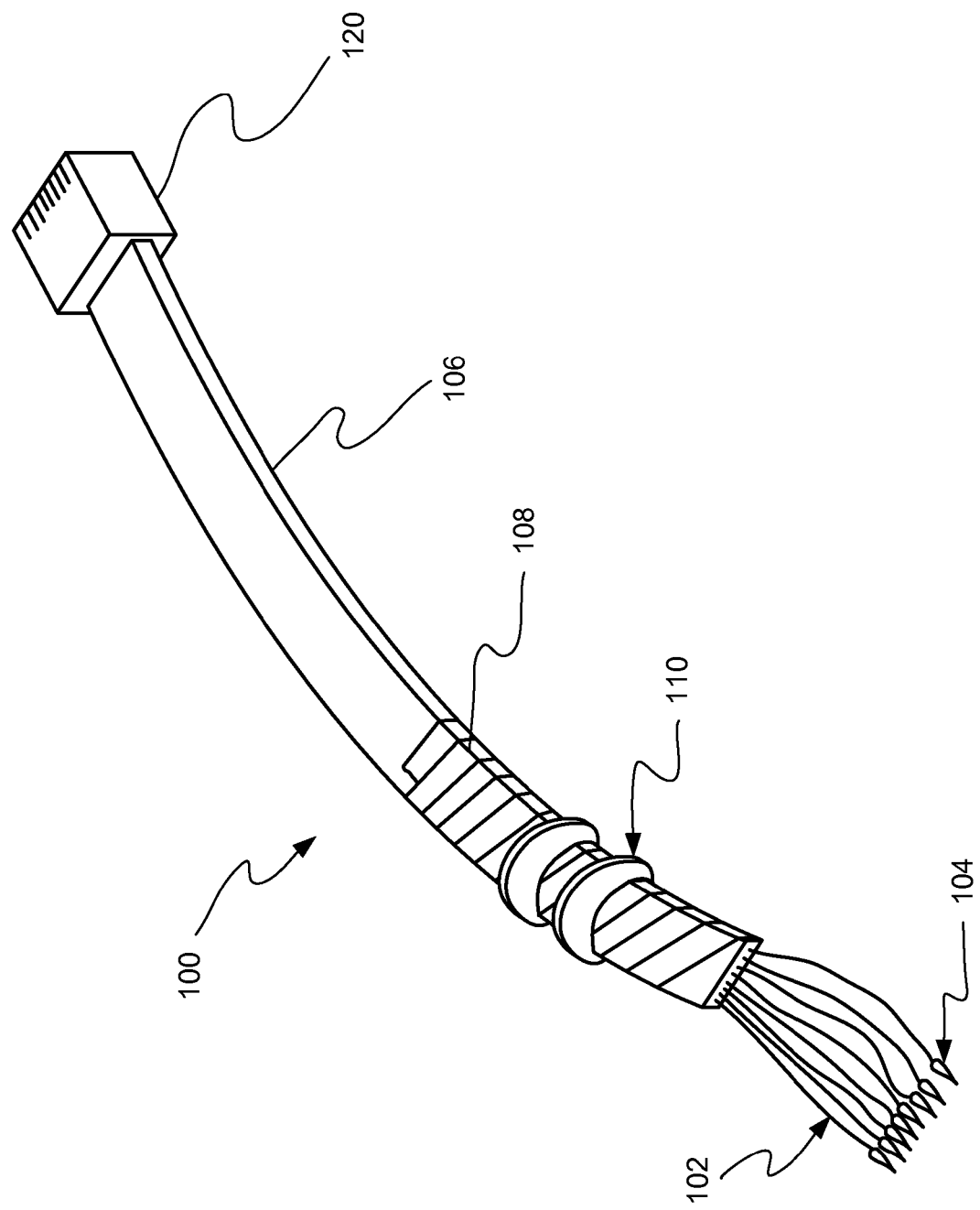
FIG. 4 is a simplified diagram of one embodiment of a connector cable that may be used with the cable adapter of FIG. 1.

FIG. 4 illustrates a simplified diagram of one embodiment of a connector cable 100 that may be used with the cable adapter of FIG. 1. Connector cable 100 may be used as either an input cable or as an output cable. Connector cable 100 includes a number of connector wires 102 bundled together. Each of the connector wires 102 has a connecting terminal 104 at one end. Connecting terminals 104 are designed in a manner so as to be connected to attachment mechanisms 30a-30h or to terminating mechanisms 34a-34h.

In one embodiment of connector cable 100, each of the connector wires 102 is color coded near connecting terminals 104. The color coding of connector wires 102 may be selected so that it the colors on the input cable matches the colors on the output cable. Alternatively, each of connector wires 102 may be alphabetically or numerically marked near connecting terminals 104. Note that in FIG. 4, connector cable 100 is shown to have eight connector wires 102, in an alternate embodiment, different number of connector wires 102 may be provided. Moreover, an input cable with eight connector wires 102 may be used with an output cable with a different number of connector wires 102. Thus for example, in an implementation of cable adapter 10 using an input cable with eight connector wires 102, output cable may have twelve connector wires. Any other combination of connector wires 102 on the input cable and the output cable may be used.

Connector wires 102 may be secured together using a non-conductive sheath 106. Such non-conductive sheath 106 may be made of any commonly known non-conductive material such as polyvinyl chloride (PVC), etc. Such non-conductive sheath 106 protects connector wires 102 from usual wear and tear as well as makes it more convenient to carry connector cable 100. In one embodiment of connector cable 100, additional protection may be provided with a wrapping 108 of hardened rubber or other material around non-conductive sheath 106. Moreover, to ensure that connector cable 100 is firmly secured in the input groove 18 or the output groove 20, one or more of plastic washers 110 may also be provided. Such plastic washers 110 may be removably but firmly attached on the outer surface of wrapping 108 or sheath 106.

Connector cable 100 is provided with a connector port 120 on one end. The connector port 120 may include pin-outs for any of the commonly used connectors such as an RJ-45 connector, a DB-9 connector, etc. The connector port 120 may be either a female port or a male port. Thus, for example, if the connector port 120 is a female port, it may be used to connect the connector cable 100 to another cable having a male port, and vice-versa.

In an alternate embodiment of th cable adapter 10, a kit containing various connector cables 100 may be provided wherein each of connector cables 100 may be of different pin-outs and of different port type (male vs. female). For example, such a kit may include a connector cable 100 with connector port 120 having male RJ-11 pin-out, another connector cable 100 with connector port 120 having female DB-9 pin-out, etc. Having the flexibility of selecting from a number of variations of connector port 120 structures allows such a kit containing cable adapter 10 to interconnect an incoming cable with a first number of wires/fibers to an outgoing cable with a different number of wires/fibers.

Each of connector terminals 104 may be communicatively connected to the one of attachment mechanisms 30a-30h. However, while it may be that in one embodiment, each of connector terminals 104 is connected to one of the attachment mechanisms 30a-30h, it is not necessary that all of connector terminals 104 are connected to at least one of the attachment mechanisms 30a-30h. Thus, for example, in one application of cable adapter 10, only four of the eight connector wires 102 of an input connector cable 100 are connected to attachment mechanisms 30a-30h. In such an application, the other four connector wires 102 of input connector cable 100 may be terminated using terminating mechanisms 34a-34h.

Figure 5:
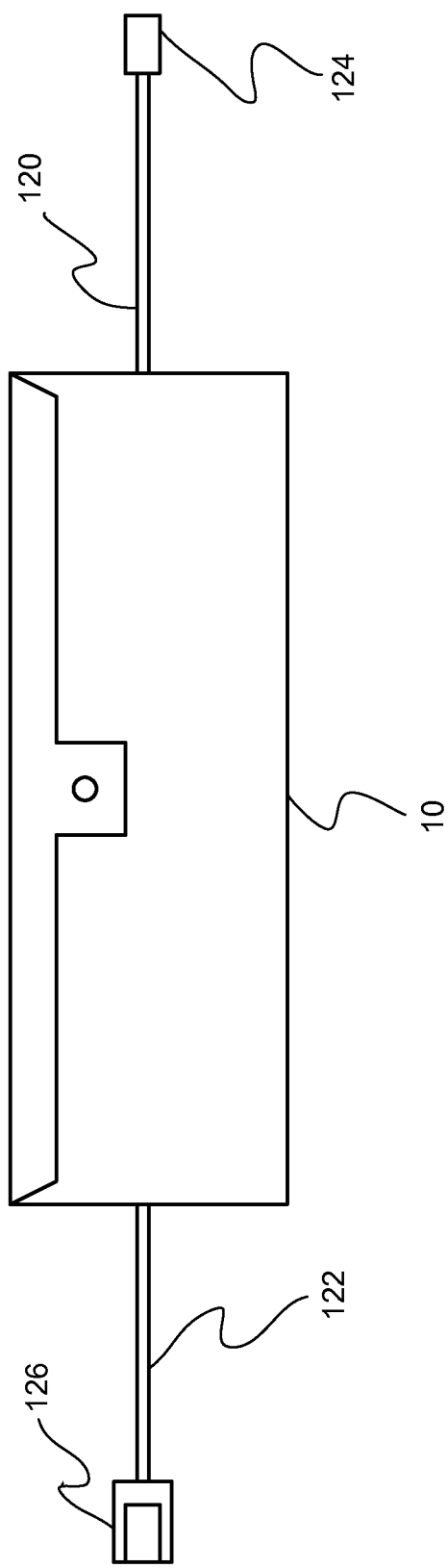
FIG. 5 is a side view of the cable adapter of FIG. 1 attached with the connector cables of FIG. 4.

FIG. 5 illustrates an embodiment where cable adapter 10 is used with two connector cables 100, one connector cable 100 being an input cable 120 and another connector cable 100 being an output cable 122. In the implementation shown herein, input cable 120 may have an RJ-45 male connector port as its input port 124. Similarly, in this implementation, output cable 122 may have an RJ-45 female connector port as its output port 126. However, in an alternate embodiment, both the input port 124 and the output port 126 may be male connectors, or both may be female connectors. The selection of input port 124 and output port 126 will depend upon the necessity of the user. Thus if the assembly of cable adapter 10 and connector cable 100 is used to connect two external cables each having a male connector, a user would select connector cables 100 for the input cable and the output cable to have female input port 124 and female output port 122. However, other combinations of input cable 120 and output cable 122 may also be used.

FIG. 6 illustrates a flowchart 200 of a method of interconnecting communication cables. At block 202, a user provides an input cable and an output cable that may be used for interconnecting communication cables. The input cable and the output cable may be similar to connector cable 100, described above. Note that depending on the type of the communication cables that need to be interconnected, the input cable and the output cable may be same or different number of connecting wires. Thus, in an example embodiment, the input cable may have eight input wires whereas the output cable may have ten output wires. Similarly, the type of port connected to the input cable may also be same or different from the type of output port connected to the output cable.

At block 204 the user provides a cable adapter similar to cable adapter 10 described above. The cable adapter may already have a connector ledge 32 with a number of attachment mechanisms 30a-30h. Alternatively, the user may have to attach such a connector ledge 32 to the container of the cable adapter 10.

At block 206, the user interconnects the input wires and the output wires to the attachment mechanisms 30a-30h. Note that in some embodiment all of the attachment mechanisms 30a-30h may be used, whereas in other embodiments only some of these attachment mechanisms 30a-30h may be used.

Subsequently, at block 208 the user provides terminating ledge similar to terminating ledge 34 and attaches it to the container of cable adapter 10. In a given embodiment, if all of the input wires are interconnected to output wires using connector ledge 32, it may not be necessary to provide terminating ledge 34. However, if there are any loose wires left, at block 210, the user may terminate such loose wires with one or more of terminating mechanisms 34a-34h of the terminating ledge 34.

In some embodiment, the above steps may be sufficient to interconnect communication cables. However, in some embodiments, at block 212 the user may provide a memory module, a measurement module, and a transceiver module with cable adapter 10. In some cases, cable adapter 10 may already be provided by a power source such as a battery, etc. Alternatively, a socket to connect AC power may also be provided with cable adapter 10. In yet another embodiment, each of the memory module, the measurement module, and the transceiver module may be provided with its own power source. The user may install one or more of these modules, as necessary, using one or more of the installation sockets provided with cable adapter 10. The installation sockets may be designed so as to provide necessary interconnections between the memory module, the measurement module, the transceiver module, and attachment mechanisms 30a-30h as necessary. If not, at block 214, the user may undertake any such interconnections between the memory module, the measurement module, and the transceiver module.

Depending on the configuration of the adapter cable 10, the user may either use the instructions provided in the memory module to receive information from the measurement module or use the transceiver module to receive information from the measurement module. If the user relies on the transceiver to communicate with the measurement module, at block 220 the transceiver may receive instructions. Subsequently, at block 222 the measurement module may undertake any measurement necessary as pursuant to the instructions from the transceiver. At block 224 the measurement information is provided to the transceiver, which, in turn, transmits such information to a target, such as a remote server, etc., as necessary.

Alternatively, if the user plans to use instructions stored in the memory module to receive information from the measurement module at block 230, such instructions may be stored in the memory module. At block 232 the instructions are communicated from the memory module to the measurement module. Subsequently, at block 234 the measurement module may undertake any measurement necessary as pursuant to the instructions from the measurement module and store the measurements in the memory at block 236. A user may access such stored instructions at any point in the future as necessary.

The invention has now been described in detail for the purposes of clarity and understanding. However, it will be appreciated that certain changes and modifications may be practiced within the scope of the appended claims.

What is claimed is:

1. A system for interconnecting communication cables, wherein the system comprises:
    an input communication cable comprising a plurality of input wires, the plurality of input wires totaling a first number of wires, the plurality of input wires, at an external end of the input communication cable, communicatively connected to a first port connector of a first type;
    an output communication cable comprising a plurality of output wires, the plurality of output wires totaling a second number of wires, wherein the second number of wires is different from the first number of wires, the plurality of output wires, at an external end of the output communication cable, communicatively connected to a second first connector of a second type, wherein the first type of port connector is different from the second type of port connector; and a cable adapter that communicatively interconnects the input communication cable and the communication output cable, the cable adapter comprising:

a container;

a lid movably attached to the container;

a plurality of attachment mechanisms located in the container, each of the plurality of attachment mechanisms defining two opposing openings and having disposed therebetween an internal conductive connector that communicatively and reversibly connects one of the plurality of input wires, at an internal end of the input communication cable, with a corresponding one of the plurality of output wires, at an internal end of the output communication cable;

a plurality of wire terminating mechanisms, each having only one opening and no internal conductive connector, that prevent communicative connections of one or more of the plurality of the input wires and one or more of the plurality of the output wires, wherein each of one or more wires of at least one of the plurality of input wires of the input communication cable or the plurality of output wires of the output communication cable that is not connected to any of the plurality of attachment mechanisms is connected to one of the plurality of wire terminating mechanisms; and a measurement module that measures communication activity on at least one of the plurality of input wires connected in at least one of the plurality of attachment mechanisms.

2. The system for interconnecting communication cables of claim 1, wherein the plurality of wire terminating mechanisms includes a plurality of input wire terminating mechanisms located on an input terminating ledge and a plurality of output wire terminating mechanisms located on an output terminating ledge.

3. The system for interconnecting communication cables of claim 1, further comprising a signaling mechanism to generate a signal regarding a state of connection between one of the plurality of input wires and one of the plurality of output wires.

4. The system for interconnecting communication cables of claim 3, wherein the signaling mechanism comprises a light source which is active when the one of the plurality of input wires is communicatively connected with the one of the plurality of output wires.

5. The system for interconnecting communication cables of claim 3, wherein the signaling mechanism generates a wireless signal when the one of the plurality of input wires is communicatively connected with the one of the plurality of output wires.

6. The system for interconnecting communication cables of claim 1, wherein the system further comprises:

an input groove on an input side of the container for inlaying the input communication cable; and an output groove on an output side of the container for inlaying the output communication cable.

7. The system for interconnecting communication cables of claim 1, further comprising:

an input cable washer attached to the input communication cable for securely fastening the input communication cable to the input groove of the container; and an output cable washer attached to the output communication cable for securely fastening the output communication cable to the output groove of the container.

8. The system for interconnecting communication cables of claim 1, wherein each of the plurality of attachment mechanisms includes a female wire connector.

9. The system for interconnecting communication cables of claim 1, wherein each of the plurality of attachment mechanisms includes a male wire connector.

10. The system for interconnecting communication cables of claim 1, wherein the container and the lid are made of a flexible material.

11. The system for interconnecting communication cables of claim 1, wherein the first port connector is a male connector and the second port connector is a female connector.

12. The system for interconnecting communication cables of claim 1, wherein each of the plurality of input wires is at least one of:

numerically labeled;

alphabetically labeled; and color coded; and each of the plurality of output wires is at least one of:

numerically labeled;

alphabetically labeled; and color coded.

13. The system for interconnecting communication cables of claim 1, further comprising:

a wireless receiver to receive instructions wirelessly, wherein the measurement mechanism is further configured to measure signal levels of at least one of the plurality of attachment mechanisms in response to instructions received by the wireless receiver; and a wireless transmitter configured to transmit information wirelessly, wherein the wireless transmitter transmits the signal levels.

14. The system for interconnecting communication cables of claim 13, further comprising a memory module, wherein:

the memory module is configured to store instructions, and wherein the measurement mechanism measures signal levels on one of the plurality of attachment mechanisms in response to instructions stored on the memory module; and the wireless transmitter is further configured to transmit the signal levels.

15. A system for interconnecting communication cables, the system comprising:

an input communication cable comprising a plurality of input wires, the plurality of input wires totaling a first number of wires, the plurality of input wires, at an external end of the input communication cable, communicatively connected to a first port connector of a first type;

an output communication cable comprising a plurality of output wires, the plurality of output wires totaling a second number of wires, wherein the second number of wires is different from the first number of wires, the plurality of output wires, at an external end of the output communication cable, communicatively connected to a second port connector of a second type, wherein the first type of port connector is different from the second type of port connector;

a cable adapter that communicatively interconnects the input communication cable and the output communication cable, the cable adapter comprising:

a container;

a lid movably attached to the container;

a plurality of attachment mechanisms located in the container, each of the plurality of attachment mechanisms defining two opposing openings and having disposed therebetween an internal conductive connector that removably connects one of the plurality of input wires, at an internal end of the input communication cable, with a corresponding one of the plurality of output wires, at an internal end of the output communication cable;

wherein one or more of the plurality of the input wires are communicatively connected with one or more of the plurality of output wires using at least one of the plurality of attachment mechanisms; and a plurality of wire terminating mechanisms, each having only one opening and no internal conductive connector, that prevent communicative connections of one or more of the plurality of the input wires and one or more of the plurality of the output wires, wherein each of one or more wires of at least one of the plurality of input wires of the input communication cable or the plurality of output wires of the output communication cable that is not connected to any of the plurality of attachment mechanisms is connected to one of the plurality of wire terminating mechanisms; and a measurement module that measures communication activity on at least one of the plurality of input wires connected in at least one of the plurality of attachment mechanisms.

16. The system of claim 15, further comprising:

a memory module removably attached to the cable adapter, wherein the measurement module is removably attached to the cable adapter and communicatively connected to the memory module, and wherein the measurement module is configured to receive an instruction from the memory module and in response to the instruction determine status of communication between one of the plurality of input wires and one of the plurality of output wires; and a transceiver module removably attached to the cable adapter and communicatively connected to the measurement module, wherein the transceiver module is adapted to receive the status of communication from the measurement module and to wirelessly transmit the status of communication.

\* \* \* \* \*